(12) United States Patent
Matsumoto et al.

(10) Patent No.: US 11,557,457 B2
(45) Date of Patent: Jan. 17, 2023

(54) CHARGED PARTICLE BEAM APPARATUS

(71) Applicant: Hitachi High-Tech Corporation, Tokyo (JP)

(72) Inventors: Kosuke Matsumoto, Tokyo (JP); Satoshi Takada, Tokyo (JP); Takashi Nobuhara, Tokyo (JP); Hirohiko Kitsuki, Tokyo (JP); Kazuo Aoki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/331,765

(22) Filed: May 27, 2021

(65) Prior Publication Data

US 2022/0028652 A1 Jan. 27, 2022

(30) Foreign Application Priority Data

Jul. 21, 2020 (JP) .............................. JP2020-124496

(51) Int. Cl.
*H01J 37/28* (2006.01)
*H01J 37/21* (2006.01)
*H01J 37/26* (2006.01)

(52) U.S. Cl.
CPC .............. *H01J 37/28* (2013.01); *H01J 37/21* (2013.01); *H01J 37/265* (2013.01)

(58) Field of Classification Search
CPC .. H01J 37/00; H01J 37/02; H01J 37/28; H01J 37/26; H01J 37/21; H01J 37/265; H01J 37/141; H01J 37/224; H01J 2237/216

USPC .......... 250/252.1, 306, 307, 311, 396 R, 397
See application file for complete search history.

(56) References Cited

U.S. PATENT DOCUMENTS

| | | | | |
|---|---|---|---|---|
| 4,831,266 A | * | 5/1989 | Frosien | H01J 37/244 250/397 |
| 6,608,308 B1 | * | 8/2003 | Takagi | H01J 37/153 250/311 |
| 7,847,249 B2 | | 12/2010 | Takahashi et al. | |
| 2006/0060781 A1 | * | 3/2006 | Watanabe | B82Y 40/00 250/310 |

(Continued)

FOREIGN PATENT DOCUMENTS

| | | |
|---|---|---|
| JP | 2008-192521 A | 8/2008 |
| JP | 2010-211973 A | 9/2010 |

*Primary Examiner* — Jason L McCormack
(74) *Attorney, Agent, or Firm* — Crowell & Moring LLP

(57) ABSTRACT

There is provided a charged particle beam apparatus that can reduce the processing time. A charged particle beam apparatus includes: an excitation control unit that controls a focal position by changing a control value of excitation of an electronic lens; an electrostatic field control unit that controls the focal position by changing a control value of an electrostatic field; a focal position height estimation unit that estimates a height of the focal position from the control value of the excitation of the electronic lens; and a control unit that controls the excitation control unit and the electrostatic field control unit. The control unit compares the height of the focal position estimated by the focal position height estimation unit with a height of a sample surface of a sample to be observed, and according to a result of comparison, determines whether it is necessary to change the control value of the excitation of the electronic lens before observing the sample.

11 Claims, 10 Drawing Sheets

(56) References Cited

U.S. PATENT DOCUMENTS

| | | | |
|---|---|---|---|
| 2007/0200947 A1* | 8/2007 | Kobaru | H01J 37/21 |
| | | | 348/345 |
| 2012/0049064 A1* | 3/2012 | Ren | H01J 37/28 |
| | | | 250/396 ML |
| 2017/0213688 A1* | 7/2017 | Ren | H01J 37/28 |
| 2019/0066969 A1* | 2/2019 | Bizen | H01J 37/261 |
| 2019/0206654 A1* | 7/2019 | Takahashi | H01J 37/12 |

* cited by examiner

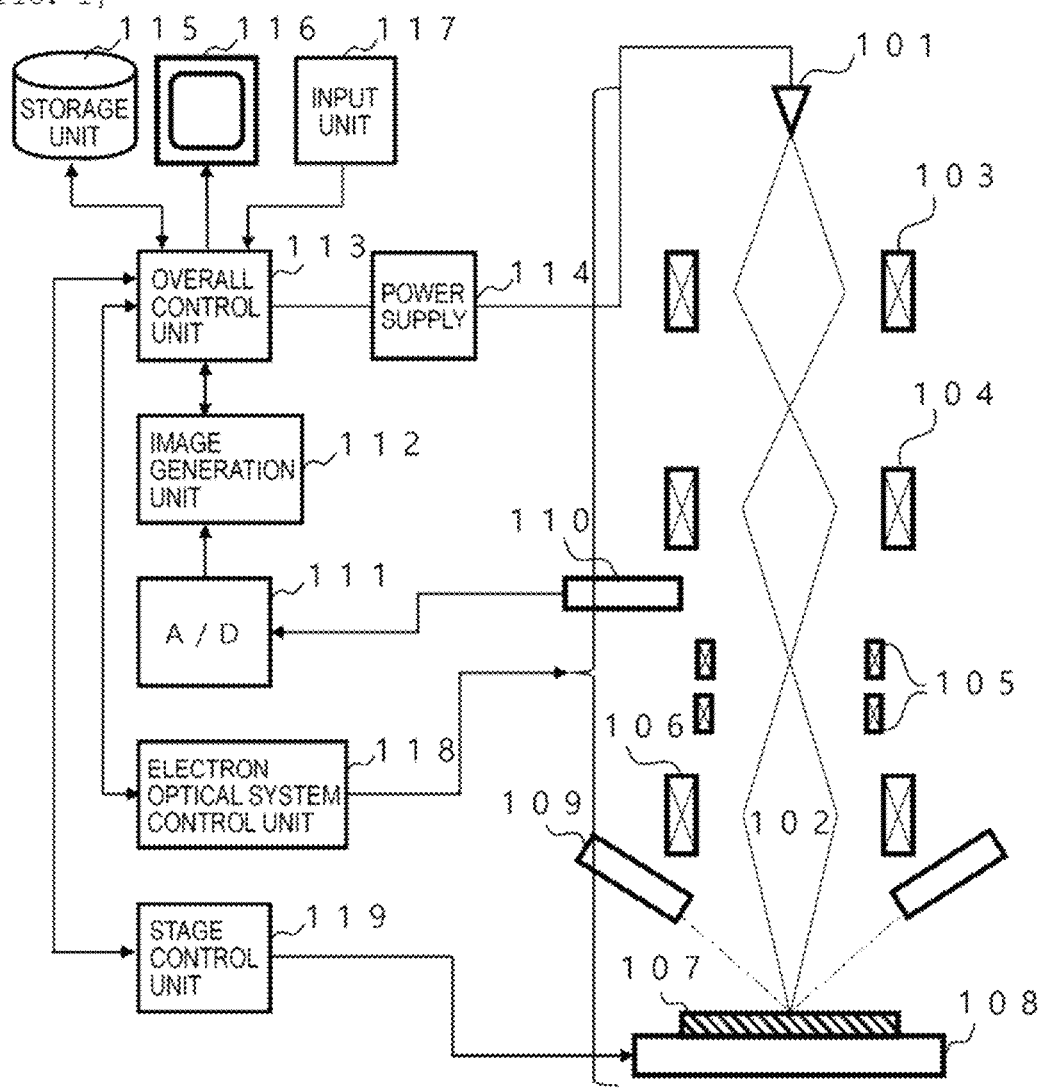

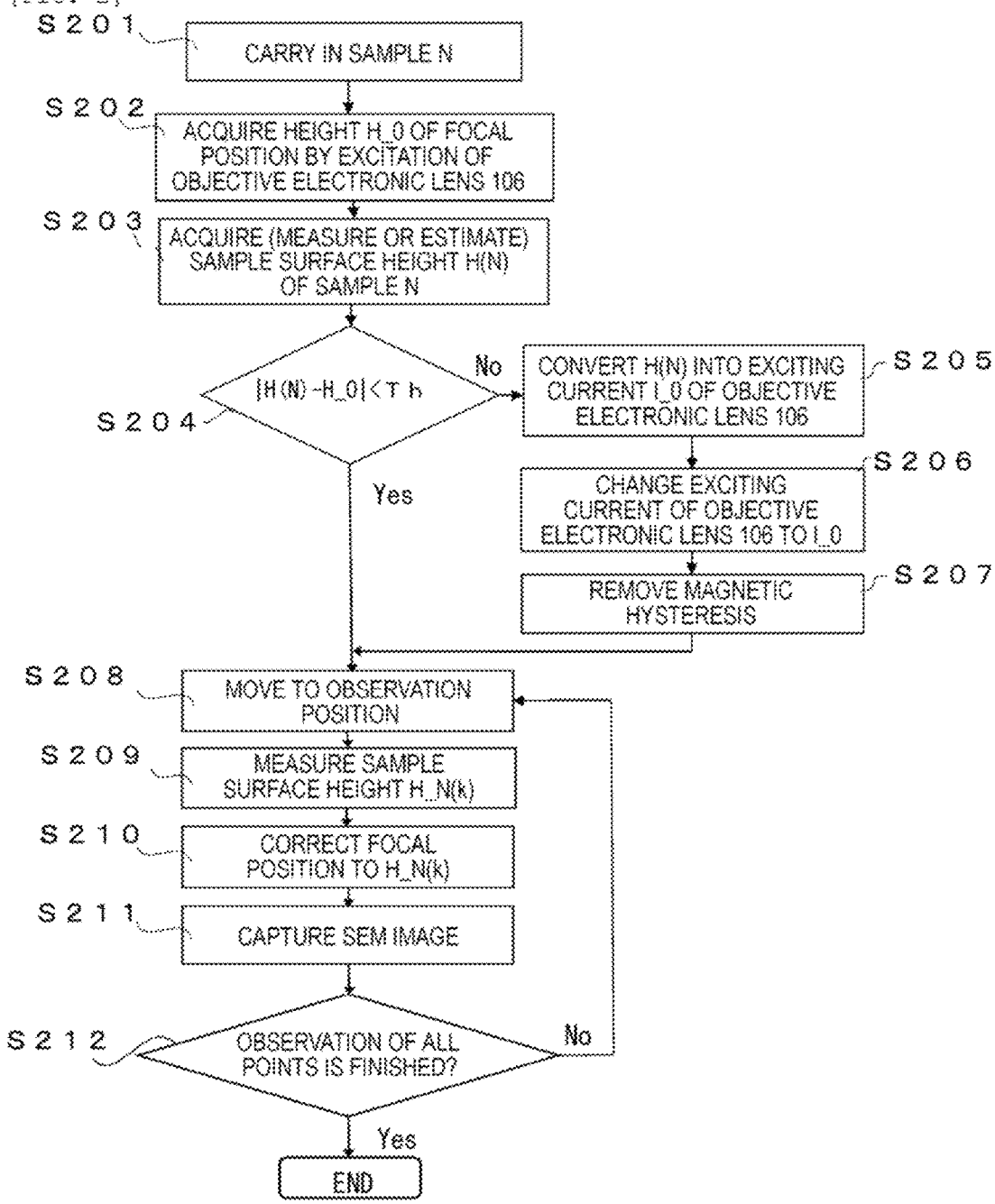

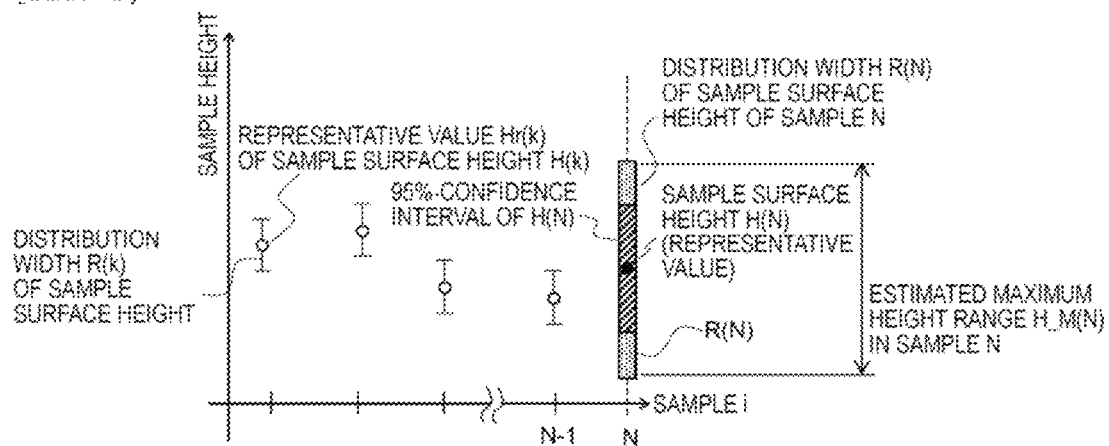

[FIG. 4]
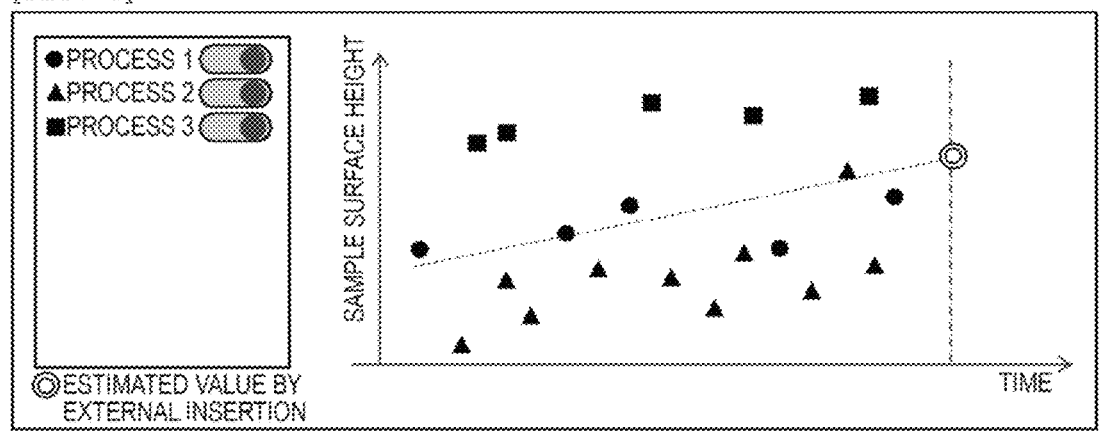

[FIG. 5]
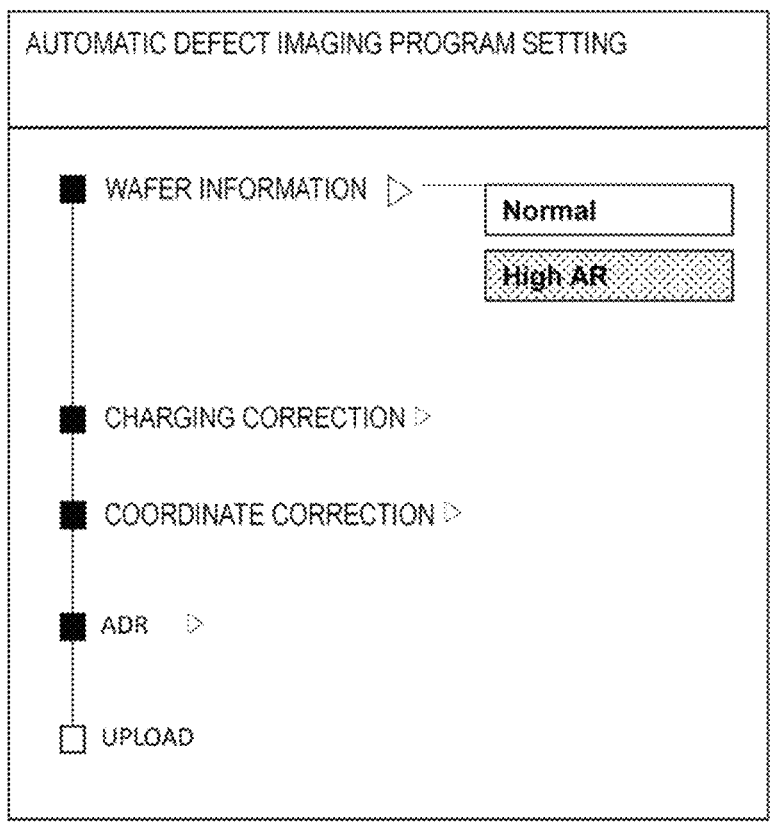

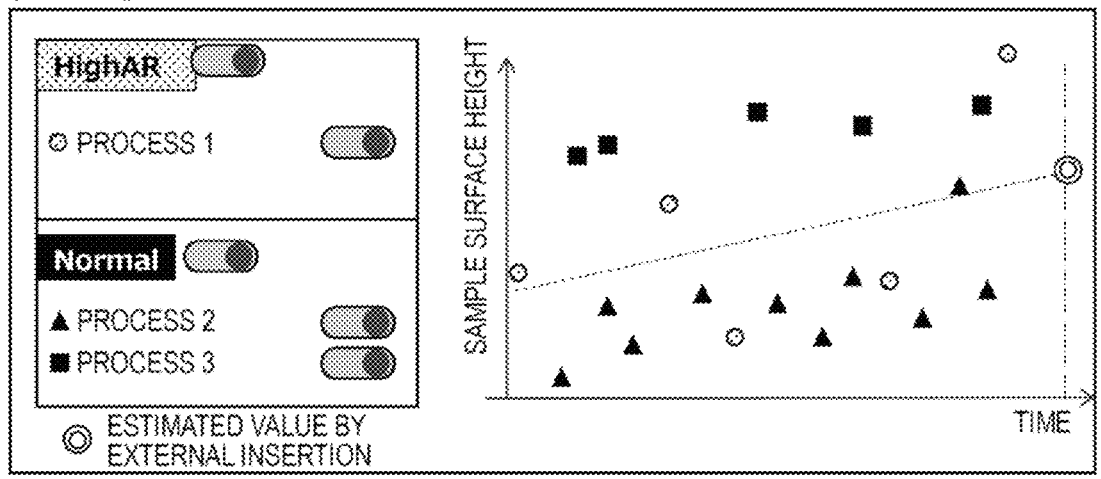
[FIG. 6]

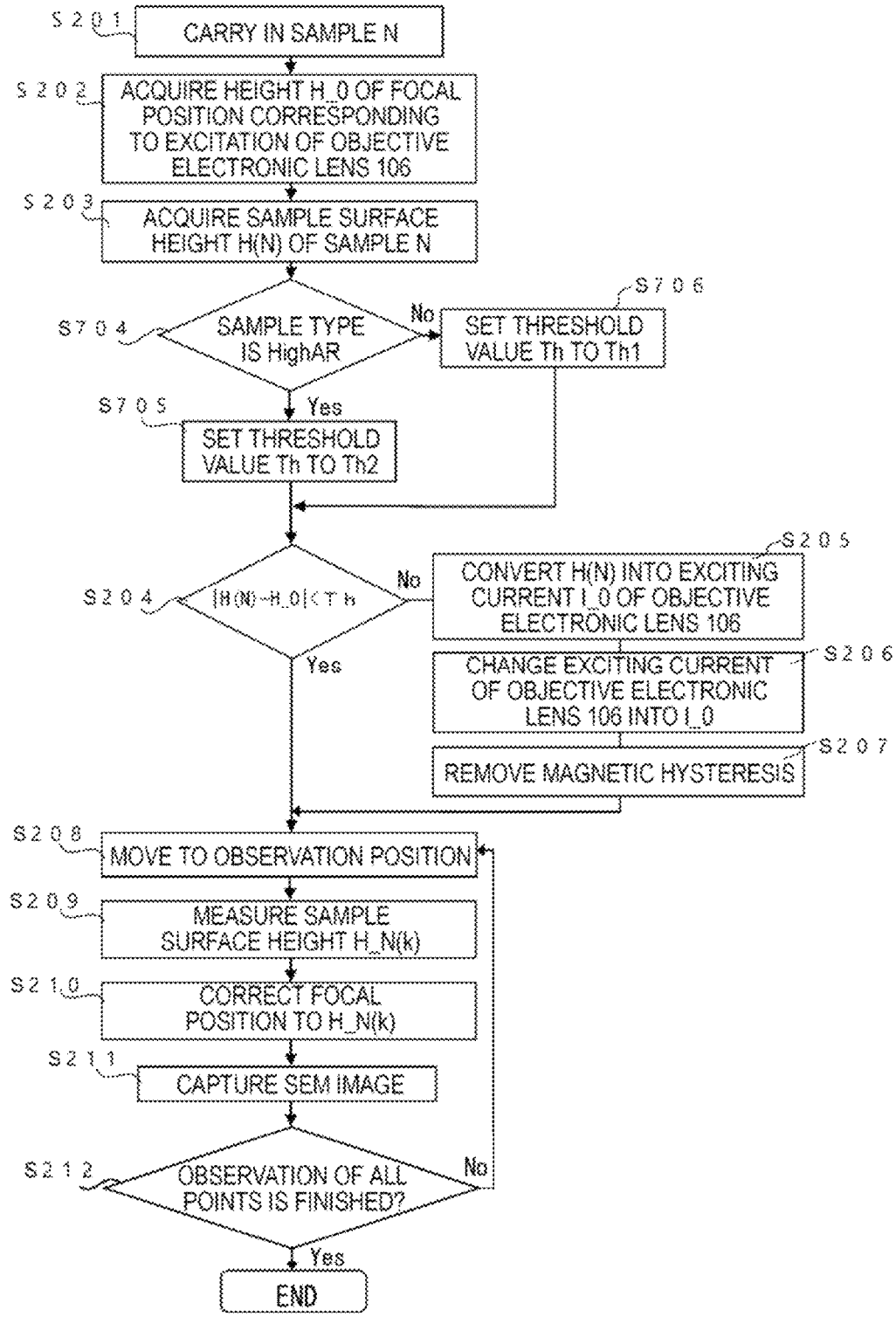

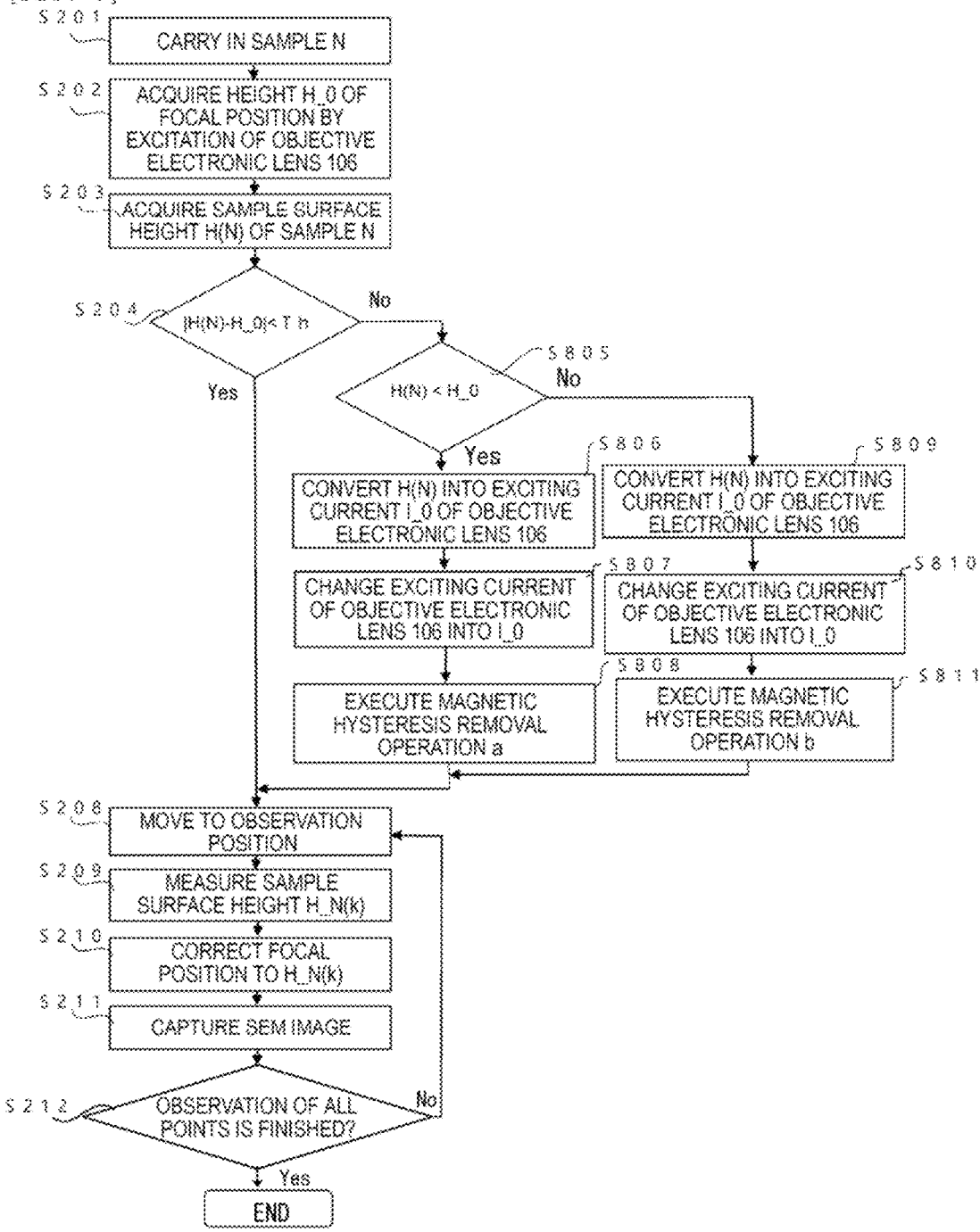

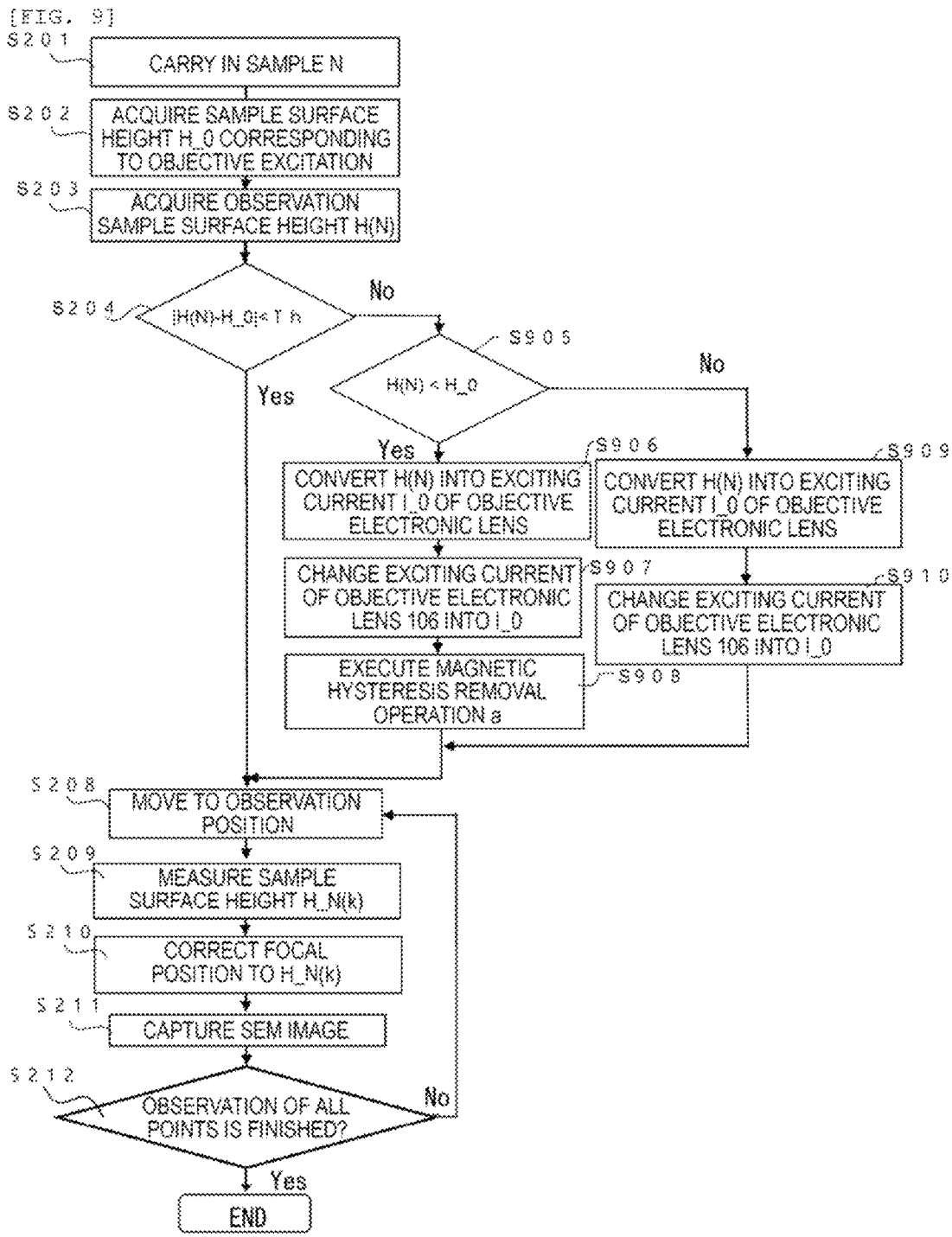

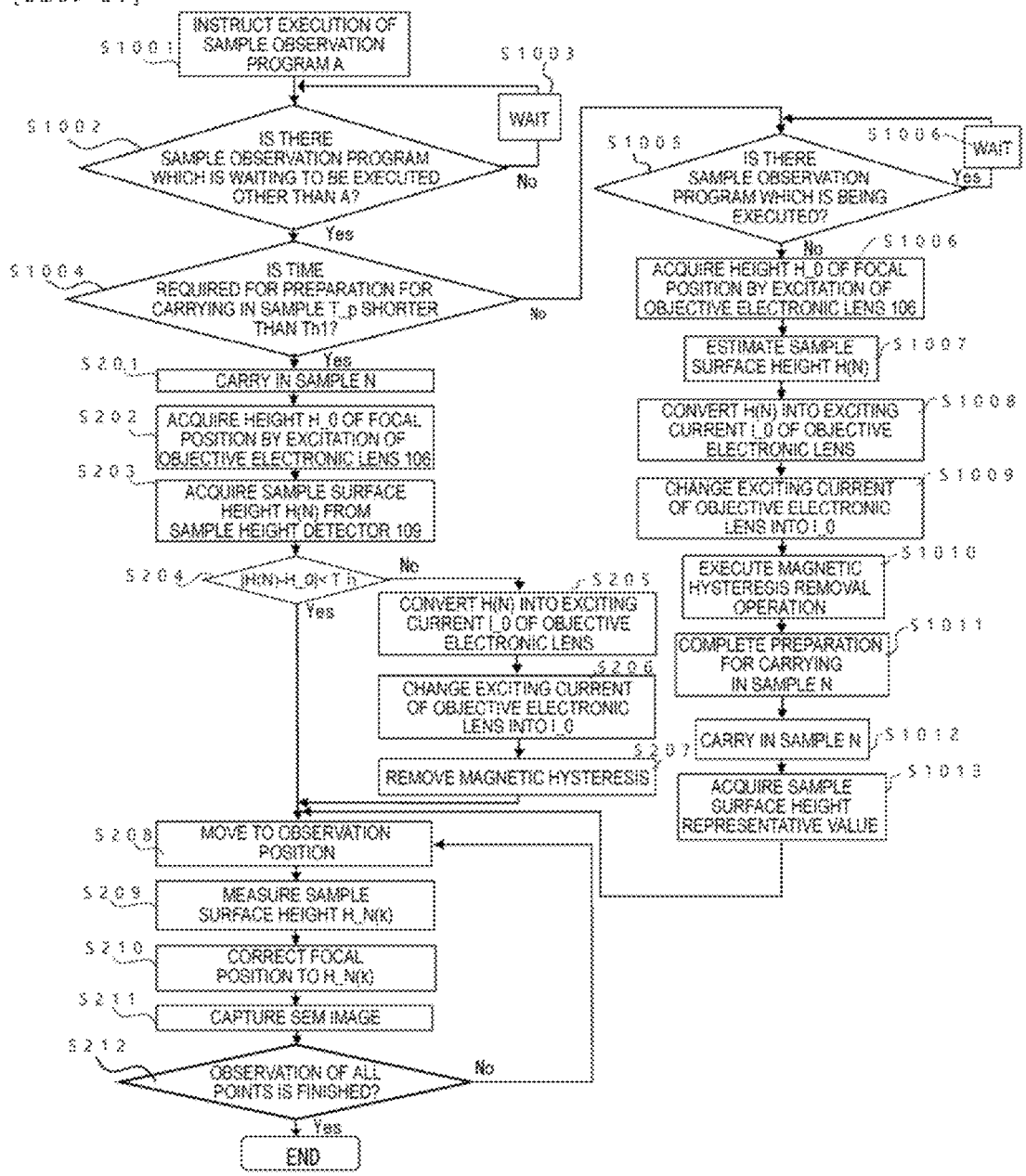
[FIG. 10]

CHARGED PARTICLE BEAM APPARATUS

TECHNICAL FIELD

The present invention relates to a charged particle beam apparatus.

BACKGROUND ART

Charged particle beam apparatuses using charged particle beams as probes, such as scanning type electron microscopes, are used in many research and development fields for the purpose of observing the microstructure of samples. As an example, in a semiconductor device manufacturing process, there is a case where defects such as foreign materials or broken wiring patterns occur on thin film devices due to inadequate or abnormal manufacturing conditions of the processing device. Since the foreign materials or defects have a significant impact on the performance of semiconductor devices, foreign material inspection or visual inspection is performed for each major process to maintain and improve yield.

In the semiconductor device manufacturing process, the inspection device used to observe foreign materials or defects is called a review SEM. The review SEM is placed in the semiconductor process and is used to automatically and continuously image the above-described foreign materials or defects. Therefore, the throughput per unit time of the review SEM has a significant impact on the productivity of semiconductors.

A large percentage of the operation time of the review SEM is the operation time of the magnetic hysteresis removal of the objective lens. The objective lens is configured with an excitation coil and a surrounding magnetic body. It is known that the magnetic field formed in the objective lens is not always proportional to the control current given to the excitation coil, but has a magnetic hysteresis that depends on the history of the excitation change. When the reproducibility of the magnetic field deteriorates due to the impact of the magnetic hysteresis, the error in the correction value for the image quality of the SEM image, such as magnification or orthogonality, increases. Therefore, a magnetic hysteresis removal operation is generally executed before changing the excitation conditions of the magnetic coil in order to control the magnetic field by removing the impact of the magnetic hysteresis (for example, refer to JP-A-2008-192521 (PTL 1)).

In recent years, the three-dimensional structure of semiconductors, which is the observation target of the review SEM, has been advancing, and there is a demand for review SEM with increasingly high acceleration voltage. As the acceleration voltage increases, the demand for the magnetic field of the objective lens also increases, and thus, the operation time of the magnetic hysteresis removal tends to increase. From such point of view, as illustrated in JP-A-2010-211973 (PTL 2), a charged particle beam apparatus has been proposed to control a focal position of the electron beam at high speed by making it possible to execute the change of the magnetic field of the objective lens together with the change of the electrostatic field. The focal position control by the electrostatic field has a narrow control range, but it is possible to control the focal position at high speed. Therefore, by combining with the focal position control by the magnetic field, the processing time of the entire apparatus is expected to be significantly reduced.

However, in a case where a large change in focal position is required, the focal position control by the magnetic field becomes necessary even in the apparatus described in PTL 2, and the processing time may become long. When the focal position can be controlled only by changing the electrostatic field by reducing the focal position control as much as possible by large changes in magnetic field, the processing time can be reduced. However, the PTL 2 does not propose a specific method.

CITATION LIST

Patent Literature

PTL 1: JP-A-2008-192521
PTL 2: JP-A-2010-211973

SUMMARY OF INVENTION

Technical Problem

An object of the present invention is to provide a charged particle beam apparatus that can reduce the processing time.

Solution to Problem

In order to solve the above-described problem, a charged particle beam apparatus according to the present invention includes: an excitation control unit that controls a focal position by changing a control value of excitation of an electronic lens; an electrostatic field control unit that controls the focal position by changing a control value of an electrostatic field; a focal position height estimation unit that estimates a height of the focal position from the control value of the excitation of the electronic lens; and a control unit that controls the excitation control unit and the electrostatic field control unit. The control unit compares the height of the focal position estimated by the focal position height estimation unit with a height of a sample surface of a sample to be observed, and according to a result of comparison, determines whether it is necessary to change the control value of the excitation of the electronic lens before observing the sample.

Advantageous Effects of Invention

According to the present invention, it is possible to provide a charged particle beam apparatus that can reduce the processing time.

BRIEF DESCRIPTION OF DRAWINGS

FIG. 1 is a schematic diagram describing a configuration of a scanning type electron microscope according to a first embodiment.

FIG. 2 is a flowchart describing an operation of the scanning type electron microscope according to the first embodiment.

FIG. 3 is a conceptual diagram describing a method for determining a threshold value Th.

FIG. 4 is a schematic diagram describing a scanning type electron microscope according to a second embodiment.

FIG. 5 is a schematic diagram describing a scanning type electron microscope according to a third embodiment.

FIG. 6 is a schematic diagram describing the scanning type electron microscope according to the third embodiment.

FIG. 7 is a flowchart describing an operation of the scanning type electron microscope according to the third embodiment.

FIG. 8 is a flowchart describing an operation of a scanning type electron microscope according to a fourth embodiment.

FIG. 9 is a flowchart describing an operation of the scanning type electron microscope according to the fourth embodiment.

FIG. 10 is a schematic diagram describing a scanning type electron microscope according to a fifth embodiment.

DESCRIPTION OF EMBODIMENTS

Hereinafter, embodiments will be described with reference to the attached drawings. In the attached drawings, there is also a case where elements that are functionally the same are displayed with the same number. The attached drawings illustrate embodiments and implementation examples according to the principles of the present disclosure, but it is for the purpose of understanding the present disclosure and are not by any means used in a limited interpretation of the present disclosure. The description in the present specification is merely a typical example and does not in any sense limit the scope of the claims or application examples of the present disclosure.

In the present embodiment, although the description thereof has been made in sufficient detail for those skilled in the art to implement the present disclosure, it is necessary to understand that other implementations and aspects are possible, and that changes in configuration and structure or substitution of various elements are possible without departing from the scope and spirit of the technical ideas of the present disclosure. Therefore, the following statements should not be interpreted while being limited thereto.

First Embodiment

FIG. 1 describes a configuration of a scanning type electron microscope according to a first embodiment. Hereinafter, a scanning type electron microscope will be described as an example of a charged particle beam apparatus, but the same method can be used for other microscopes using charged particles. It is also possible to use a combination of a plurality of imaging devices.

The scanning type electron microscope illustrated in FIG. 1 includes an electron gun 101, a first electron lens 103, a second electron lens 104, a deflector 105, an objective electron lens 106, a sample stage 108, a sample height detector 109, a secondary electron detector 110, an A/D conversion unit 111, an image generation unit 112, an overall control unit 113, a high-voltage power supply 114, a storage unit 115, a display unit (display) 116, an input unit 117, an electron optical system control unit 118, and a stage control unit 119.

A semiconductor wafer 107 as the observation target is placed on the sample stage 108 that can be moved in the XY direction. The sample stage 108 moves in the XY direction based on the instruction signal from the stage control unit 119.

The electron gun 101 is connected to the high-voltage power supply 114. Voltage is applied to the electron gun 101 from the high-voltage power supply 114 based on the instruction signal from the overall control unit 113. The electron beam 102 emitted from the electron gun 101 is converged by the first electron lens 103, the second electron lens 104, and the objective electron lens 106, and is scanned over the semiconductor wafer 107 by the deflector 105. The electron beam 102 is given an acceleration voltage of 10 kV or more as an example. The first electron lens 103, the second electron lens 104, and the objective electron lens 106 are each equipped with an excitation coil, and by controlling the exciting current, the magnetic field is changed and the focal position of the electron beam 102 is controlled.

When the semiconductor wafer 107 is irradiated with the electron beam 102, secondary electrons or backscattered electrons are generated from the semiconductor wafer 107. The secondary electrons arriving at the secondary electron detector 110 are converted into current, and then converted into digital signals by the A/D conversion unit 111. The image generation unit 112 generates the SEM image of the semiconductor wafer 107 and performs image processing according to the digital signal. Although not illustrated in the drawing, a backscattered electron detector may be provided in addition to the secondary electron detector 110.

As an example, the sample height detector 109 includes a light source that irradiates the semiconductor wafer 107 as a sample with light from a diagonal direction, and a photodetector that detects the reflected light. The height of the position of the surface of the semiconductor wafer 107 can be detected by determining the light-receiving state in the photodetector.

The storage unit 115 and the display unit 116 are connected to the overall control unit 113. The SEM image generated by the image generation unit 112 is stored in the storage unit 115 via the overall control unit 113 and displayed on the display unit 116. The user who uses a review SEM can use the input unit 117 to give instructions to the overall control unit 113 and also to enter control conditions and other items.

The overall control unit 113 outputs instructions to the high-voltage power supply 114, the electron optical system control unit 118, and the stage control unit 119 based on user input and a pre-recorded program, and controls each unit, such as changing the imaging conditions of the SEM image and changing the imaging position. The electron optical system control unit 118 functions as an excitation control unit that adjusts the focal position by generating a change in magnetic field by controlling the exciting current to the excitation coils of the first electron lens 103, the second electron lens 104, and the objective electron lens 106, and also functions as an electrostatic field control unit that adjusts the focal position by generating a change in the electrostatic field by controlling the voltage or current. The overall control unit 113 also functions as a focal position height estimation unit that estimates the height of the focal position of the electron beam 102 from the control values of the exciting currents for the excitation coils of the first electron lens 103, the second electron lens 104, and the objective electron lens 106.

Since the focal depth of scanning type electron microscopes (SEM) is shallow, it is necessary to adjust the focal position in many cases before capturing the SEM image. The scanning type electron microscope of the present embodiment is configured such that the focal position can be adjusted by changing the magnetic field by changing the control value of the objective electron lens 106, the first electron lens 103, or the second electron lens 104, and the focal position can be adjusted by changing the electrostatic field by changing the control value of the retarding voltage applied to the sample stage 108 or the booster voltage applied to the objective electron lens 106.

While the focal position control method using the magnetic field change has a wide range of controllable focal positions, it is disadvantageous that the processing time is long since it is necessary to statically wait for the sequence or the magnetic field to ensure the reproducibility of the magnetic field. Meanwhile, the focal position control method using the electrostatic field has a short processing time, it is disadvantageous that the control range is limited in terms of ensuring the linearity of the control value and the electrostatic field.

It is possible to control both the focal position using the magnetic field change and the focal position using the electrostatic field in one scanning type electron microscope, and accordingly, it is possible to contribute to shortening the processing time for the focal position control and improve the throughput of the apparatus.

The scanning type electron microscope according to the first embodiment is a scanning type electron microscope that can control both the focal position using such a magnetic field change and the focal position using the electrostatic field, and is also capable of executing the operations described in detail below. Accordingly, compared to apparatuses in the related art, it is possible to further reduce the processing time.

With reference to the flowchart in FIG. 2, the procedure of the scanning type electron microscope according to the first embodiment, from the carry-in of the semiconductor wafer 107, which is the observation target, to the end of observation, is described. In the following description, the semiconductor wafer 107 (the N-th sample), which is on the sample stage 108 and is to be newly observed by executing the focusing operation, is referred to as "sample N". Meanwhile, the N−1 samples that are already become targets of observation (already been observed) prior to the observation of the sample N are collectively referred to as "sample group i". The k-th (k=1 to N−1) sample measured in the sample group i is referred to as "sample k". In the present embodiment, when observing a sample N to be newly measured, it is determined whether it is necessary to control the focal position by changing the magnetic field according to the data of the sample position height obtained when observing the measured sample group i, and further, when necessary, the focal position is controlled by changing the electrostatic field.

In the observation of the sample N, the sample N, which is the observation target, is first carried in on the sample stage 108 (step S201). Then, a height H_0 of the focal position corresponding to the excitation (exciting current flowing in the excitation coil) of the objective electron lens 106 is acquired by the overall control unit 113 (step S202). The "excitation of the objective electron lens 106" here can be the average value of the exciting current of the objective electron lens 106 in the measurement of the observed sample group i, or the value of the exciting current of the objective electron lens 106 in the measurement of the last (immediately preceding) measured sample N−1. In other words, in step S202, the height H_0 of the focal position corresponding to the exciting current that flowed in the excitation coil of the objective electron lens 106 in the measurement of at least one of the measured sample groups i is acquired.

Next, in step S203, using the sample height detector 109, the data of the sample surface height H(N) of the sample N placed on the sample stage 108 is acquired by measurement or estimation. The sample surface height H(N) can be measured by the sample height detector 109, as an example. Specifically, the measurement is performed by irradiating the surface of the sample N with the measurement light, receiving the reflected light by the photodetector, and analyzing the received signal. The sample height detector 109 can measure the sample surface height H(N) according to the output of the photodetector, based on the reflected light by irradiating one point of the surface of the sample N with the measurement light. Otherwise, the sample height detector 109 can also irradiate a plurality of points on the surface of the sample N with the measurement light, and measure the sample surface height H(N) by the average value of the plurality of measured values.

Instead of using the sample height detector 109, the sample surface height H(N) of the sample N may be estimated in the overall control unit 113 using calculated values such as the average value and the median value of the sample surface heights of the sample group i measured for the plurality of samples i observed in advance.

Then, an absolute value |H(N)−H_0| of the difference between the height H_0 of the focal position and the sample surface height H(N) of the sample N, is compared with the threshold value Th (step S204). The threshold value Th can be determined based on the range of controllable focal positions by other methods without changing the magnetic field, as described below. In a case where information on the distribution (variation) of the sample surface height H(N) of the sample N is given, the information can also be considered, and it is possible to determine the threshold value Th. The details will be described later.

In step S204, in a case where it is determined that |H(N)−H_0|<Th (Yes), in the observation of the sample N, the control of the focal position by the magnetic field change is not performed, the control of the focal position only by the change in electrostatic field is possible, and the process moves to step S208. Meanwhile, in a case where it is determined in step S204 that 1H(N)−H_0|≥Th (No), in the observation of the sample N, only by the control of the focal position by changing the electrostatic field, it is not possible to perform the focusing operation (since the control range is narrow), it is determined that the focal position control by the magnetic field change is separately necessary, and the process moves to step S205.

In step S205, the exciting current I_0 of the objective electron lens 106 is converted from the surface position height H(N) of the sample N. In other words, the exciting current I_0 of the objective electron lens 106 is calculated such that focus is obtained at the surface position height H(N) of the sample N. The exciting current of the objective electron lens 106 is changed to the calculated value I_0 (S207). In other words, the focal position is changed by changing the exciting current. Next, so-called magnetic hysteresis removal is performed on the objective electron lens 106 (step S207), and the process moves to step S208. Specifically, after the current flowing to the excitation coil of the objective electron lens 106 is increased to a certain value, the current is decreased again, and then increased to the value I_0. Accordingly, the magnetic hysteresis of the objective electron lens 106 is removed.

As described above, when Yes is determined in step S204, the process moves directly to step S208. When No is determined, steps S205 to 207 are executed to control the focal position by changing the magnetic field, and then the process moves to step S208. By performing the procedure of S204 to 207, it is possible to execute the control of the focal position by changing the magnetic field, which takes time, at a stage before the start of observation.

In step S208, the stage control unit 119 controls the sample stage 108 to move the sample N to the observation position. By the sample height detector 109, the sample surface height H_N(k) of the sample N at that observation position is measured (step S209). The difference between the sample surface height H_N(k) measured by the sample height detector 109 and the sample surface height H(N) measured or estimated in step S203 is calculated, and according to such difference, the electrostatic field is controlled to correct the height of the focal position to H_N(k) (step S210). After the correction ends, the SEM image obtained at that time is captured (step S211). The procedure is repeated for all the observation points (step S212).

Next, referring to FIG. 3, the calculation method of the threshold value Th used in step S204 of FIG. 2 will be described. FIG. 3 illustrates the distribution width R(k) (k=1 to N−1) of the sample surface height H(k) and the representative value Hr(k) of the sample surface height H(k) on the sample surface of each of the N−1 samples in the sample group i. Each of the N−1 samples in the sample group i has a different distribution width R(k) and a different representative value Hr(k).

Based on the representative value Hr(k) of the sample surface height H(k) and the distribution width R(k) of the sample surface height of the sample k in the sample group i (k=1 to N−1), the sample surface height H(N) (representative value) and the distribution width R(N) of the sample surface height H(N) of the sample N to be newly measured can be estimated. The sample surface height H(N) and the distribution width R(N) of the sample surface height H(N) (representative value) of the sample N are calculated by the following equation.

$$H(N) = \frac{1}{N}\sum_{0}^{N} H(k) \quad \text{[Equation 1]}$$

$$R(N) = \frac{1}{N}\sum_{0}^{N} R(k) \quad \text{[Equation 2]}$$

The maximum distribution width H_M(N) of the sample surface of the sample N is described as following [Equation 3]. σ(H(k)) is a standard deviation of the sample surface height H(k) of the sample group i, and is an indicator of the error in the estimation of H(N). In other words, H_M(N) is determined according to the sample surface height H(N) of the sample N, the 95%-confidence interval (3σ), and the distribution width R(N). The above-described threshold value Th can be set based on the H_M(N).

$$H\_M(N)=H(N)\pm(R(N)+3\times\sigma(H(k)))  \quad \text{[Equation 3]}$$

In a case where the height H_0 of the focal position acquired in step S202 falls within the range of this maximum distribution width H_M(N), it is possible to determine that the focal position can be controlled by a method other than changing the magnetic field in the continuous imaging of the samples 1 to N. The threshold value Th can be calculated by the following equation.

$$Th=R\_e-(R(N)+3\times\sigma(H(i))) \quad \text{[Equation 4]}$$

As described above, according to the first embodiment, it is possible to determine whether it is necessary to adjust the focal position by changing the excitation before starting the observation of the sample N, and thus, it is possible to omit adjustment of the focal position by the excitation change during the observation operation in some cases, and the processing time of the sample can be shortened.

Second Embodiment

Next, referring to FIG. 4, the charged particle beam apparatus according to a second embodiment will be described. Here, the scanning type electron microscope (SEM) will be used as an example of the charged particle beam apparatus, but the following embodiment is also applicable to a charged particle beam apparatus other than the scanning type electron microscope.

The overall configuration of the scanning type electron microscope according to the second embodiment is the same as that of the first embodiment (FIG. 1). The procedure of the observation operation is also substantially the same as that of the first embodiment (FIG. 2). However, compared to the first embodiment, the second embodiment differs in the method of estimating the sample surface height H(N) and the like of the sample N, which is the observation target.

FIG. 4 is an example of the display screen displayed on the display unit 116 when the user creates a sample observation program. The graph on the right side of the screen in FIG. 4 illustrates the sample surface height measured in the sample group i (samples 1 to N−1) with different symbols (black circles, black triangles, and black squares) for different sample types (for different processes).

In the graph on the right side of the screen in FIG. 4, the vertical axis represents the sample surface height (H(k), H(N)), and the horizontal axis represents the time. Instead, the horizontal axis can be the number of times of program execution, the coordinates of the sample surface, the air pressure, the air temperature, or the sample preparation conditions, or a combination thereof. For example, by plotting the sample surface height H(k) against the time, it is possible to clearly show the change in the sample surface height due to deformation of the mechanical structure caused by conditions such as ambient temperature or external pressure.

Based on the trend of the sample surface height H(k) illustrated in the graph on the right side of the screen in FIG. 4, the user can select the sample type (processes 1 to 3) to be used for the estimation of the sample surface height of the sample N by operating a toggle switch on the selection screen on the left side of the screen. The toggle switch is moved to the right for the sample type to be selected, and the toggle switch is moved to the left for the sample type which is not to be selected. The characters "processes 1 to 3" on the selection screen can also be displayed in other manners as long as the characters represent the type of the sample. The selection of the sample type may be performed manually by the user or by automatic selection by the program.

As the number of sample types (processes) to be selected increases, the information that is used to estimate the sample surface height of the sample N increases. When the sample types with the same trend and close true values are selected, the accuracy of the estimation increases. Meanwhile, there are cases where samples with largely different sample heights are observed due to factors such as poor preparation, and when the estimation of the sample height including such information is performed, the estimated accuracy may deteriorate. The screen display example in FIG. 4 makes it possible for the user to exclude specific sample types having problems from the information used to estimate the sample surface height of the sample N, according to the overall trend of the sample surface height measurement performed in advance.

On the screen in FIG. 4, the sample surface height H(N) of the sample N is estimated by extrapolation based on the distribution of the sample surface height H(k) of the sample group i, based on the input of the user as described above. The data for the sample surface height H(k) used for extrapolation is selected based on the above-described selection of the user. The information used to calculate the standard deviation σ (H(i)) and the maximum distribution width H_M(N) described in the first embodiment can also be selected based on the sample type selected by the user. For the sample surface height H(k) of the sample group i used for extrapolation, it is appropriate to perform a moving average of several points and use a monotonically changing region.

Third Embodiment

Next, referring to FIGS. 5 to 7, the charged particle beam apparatus according to a third embodiment will be described. Here, the scanning type electron microscope (SEM) will be used as an example of the charged particle beam apparatus, but the following embodiment is also applicable to a charged particle beam apparatus other than the scanning type electron microscope.

The overall configuration of the scanning type electron microscope according to the third embodiment is the same as that of the first embodiment (FIG. 1). The procedure of the observation operation is also substantially the same as that of the first embodiment (FIG. 2). However, compared to the first embodiment, the third embodiment differs in the method of estimating the sample surface height H(N) and the like of the sample N, which is the observation target.

FIG. 5 is an example of the screen displayed on the display unit 116 when the user creates a sample observation program in the SEM according to the third embodiment. In FIG. 6, the characters such as "wafer information" or "charging correction" indicate the sequence of sample observation or setting items, and the user can use the input unit 117 to select and set the sequence to be executed. For example, the black rectangle symbol to the left of each character displays the degree of progress in the sequence (blackening means that the execution is done and white outline means that the execution is not done).

By selecting the triangle mark on the right side of each letter with the mouse or the like, the detailed setting screen for each item can be displayed. For example, in FIG. 5, when the user selects the triangle mark on the right side of "wafer Information" indicating that the setting item for detailed sample settings, the characters "Normal" and "HighAR" are displayed further on the right side of the triangle mark to encourage the user to make settings. The character "HighAR" indicates a sample with a large height difference in the structures of the sample surface, and "Normal" indicates that the sample is a sample other than the sample (a sample with a small height difference).

In a case of observing a sample in which the structures on the sample surface have a height difference of a few microns, the user can select "HighAR" as an example, since it is necessary to consider the height of the structures on the sample in estimating the distribution width of the sample surface height.

FIG. 6 illustrates an example of a screen for predicting the sample surface height H(N) and the like for the sample N after entering the program settings described in FIG. 5 for the plurality of sample types (processes). The screen in FIG. 6 is an example of the screen to be displayed in a case of estimating the sample surface height for the sample N to be newly measured after the program is executed plural times with the screen in FIG. 5 for the plurality of sample types.

The difference between the screen in FIG. 6 and the screen in the second embodiment (FIG. 4) is that the sample types are displayed separately on the left side of the screen based on the recipe settings of "HighAR" or "Normal" entered on the screen in FIG. 5.

The sample type corresponding to "HighAR" ("process 1" in FIG. 6) is displayed on the upper left side of the screen, and the sample types corresponding to "Normal" ("process 2" and "process 3" in FIG. 6) are displayed on the lower left side of the screen. Next to the characters "HighAR" or "Normal", the toggle switch is displayed, the toggle switch is moved to the left, and accordingly, the data of the sample type according to "HighAR" or "Normal" is excluded collectively (the corresponding data plots will also be erased collectively from the graph on the right).

The toggle switch is also displayed next to the display for each sample type (processes 1 to 3). By moving the toggle switch to the left, data for individual sample types can be excluded individually (the corresponding data plots are also erased from the graph on the right). On the screen, the user can more easily and clearly perform estimation of the sample surface height while being aware of the execution result in the recipe setting of "Normal" or "High AR". The above-described screen display example illustrates a split display using "Normal" or "HighAR", but a similar implementation using other user input information and environmental conditions is also possible. The threshold value Th calculated in [Equation 4] of the first embodiment can be set by the settings selected based on the screen display in FIG. 5.

With reference to the flowchart in FIG. 7, the procedure of the scanning type electron microscope according to the third embodiment, from the carry-in of the semiconductor wafer 107, which is the observation target, to the end of observation, is described. In FIG. 7, the same steps as those in FIG. 2 are indicated with the same reference numerals as those in FIG. 2, and thus, duplicate description will be omitted below. In the third embodiment, after step 203, it is determined whether the sample type of the sample N corresponds to "HighAR" (step S704). In a case of No, the threshold value is set to Th1 in step S706. The threshold value Th1 is calculated by [Equation 4] of the first embodiment.

Meanwhile, in a case where the sample type of the sample N is HighAR (Yes), the threshold value Th is set to Th2 in step 705. The threshold value Th2 can be a value in which a constant is added to the threshold value Th1, or a value calculated using [Equation 4] using only the data of the sample i of which the sample type is HighAR. After the threshold value Th is set in step S705 or S706, the process moves to step S204 and thereafter is the same as those of the first embodiment.

According to the third embodiment, the threshold value can be set according to the sample type of the sample N, and thus, it is possible to more accurately determine whether it is necessary to adjust the focal position by changing the excitation, and the processing time is expected to be further reduced.

Fourth Embodiment

Next, referring to FIG. 8, the charged particle beam apparatus according to a fourth embodiment will be described. Here, the scanning type electron microscope (SEM) will be used as an example of the charged particle beam apparatus, but the following embodiment is also applicable to a charged particle beam apparatus other than the scanning type electron microscope.

The overall configuration of the scanning type electron microscope according to the fourth embodiment is the same as that of the first embodiment (FIG. 1). The procedure of the observation operation is also substantially the same as that of the first embodiment (FIG. 2) except the parts described below.

Referring to the flowchart in FIG. 8, the procedure of the scanning type electron microscope according to the fourth embodiment, from the carry-in of the semiconductor wafer 107, which is the observation target, to the end of observation, is described. In FIG. 8, the same steps as those in FIG. 2 are indicated with the same reference numerals as those in FIG. 2, and thus, duplicate description will be omitted below. In the fourth embodiment, after No is determined in step S204, the process moves to step S805, and it is determined whether H_0<H(N).

In a case of Yes, after converting the acquired sample surface height H(N) into the exciting current I_0 of the objective electron lens 106 (step S806), the value of the exciting current of the objective electron lens 106 is changed to I_0 (step S807). A magnetic hysteresis removal operation a is executed (step S808).

Meanwhile, in a case of No, after converting the acquired sample surface height H(N) into the exciting current I_0 of the objective electron lens 106 (step S809), the value of the exciting current of the objective electron lens 106 is changed to I_0 (step S810). A magnetic hysteresis removal operation b different from the magnetic hysteresis removal operation a is executed (step S811).

The impact of the magnetic hysteresis largely varies in a case where the exciting current of the objective electron lens 106 is changed to a higher value than the current value, and in a case where the exciting current is changed to a lower value than the current value. For example, in a case of operation in which the excitation is always set to the positive direction after removing the magnetic hysteresis, when the exciting current is changed to the positive direction, the control of the focal position is unlikely to receive impact of the magnetic hysteresis. In the fourth embodiment, the magnetic hysteresis removal operation a and the magnetic hysteresis removal operation b are used separately based on the comparison of the magnitude of H_0 and H(N). According to such method, the appropriate magnetic hysteresis removal operation can be executed according to the magnitude of the impact of the magnetic hysteresis, and it is possible to reduce the time required for the magnetic hysteresis removal operation and consequently reduce the processing time. As illustrated in FIG. 9, the magnetic hysteresis removal operation a may be executed only in a case where "Yes" is determined in step S905, and in a case of "No", the magnetic hysteresis removal operation may be omitted.

Fifth Embodiment

Next, referring to FIG. 10, the charged particle beam apparatus according to a fifth embodiment will be described. Here, the scanning type electron microscope (SEM) will be used as an example of the charged particle beam apparatus, but the following embodiment is also applicable to a charged particle beam apparatus other than the scanning type electron microscope.

The overall configuration of the scanning type electron microscope according to the fifth embodiment is the same as that of the first embodiment (FIG. 1). The procedure of the observation operation is also substantially the same as that of the first embodiment (FIG. 2) except the parts described below.

With reference to the flowchart in FIG. 10, the procedure of the scanning type electron microscope according to the fifth embodiment, from the carry-in of the semiconductor wafer 107, which is the observation target, to the end of observation, is described. In FIG. 10, the same steps as those in FIG. 2 are indicated with the same reference numerals as those in FIG. 2, and thus, duplicate description will be omitted below. This operation in FIG. 10 is an addition to the operation in FIG. 2, with the addition of the operations in steps S1001 to S1013.

In the operation of FIG. 10, first, after the execution of a sample observation program A is instructed, it is determined whether there is a sample observation program waiting to be executed other than the program A (step S1002). In a case where there is a program waiting to be executed, the program waits until the execution ends (step S1003).

In a case where there is no program waiting to be executed (step S1002), before moving to the same procedure (S201 to S212) as that in the first embodiment, it is determined whether the time T_p required for preparation for carrying in the sample N is shorter than the threshold value Th1 (step S1004). In a case of YES, the process moves to step 201, and the operation thereafter is the same as those of the first embodiment.

Meanwhile, in a case of NO, the process moves to step S1005. In step S1005, it is determined whether there is a sample observation program being executed other than the sample observation program A. In some cases, the program waits until the execution ends (step S1006). When the program being executed ends, the operations of steps S1006 to 1013 are started. In steps S1006 to S1010, the preparation for carrying in the sample N is completed in step 1011, and before the sample N is carried in step S1012, the exciting current of the objective electron lens 106 is adjusted regardless of the magnitude relationship between the sample surface height H(N) and the height H_0 of the focal position. In other words, the same operations as those of step 202 to step S207 are executed. Since the time until the sample N is carried in is sufficiently long to allow sufficient time to change the excitation of the objective electron lens 106, such an operation does not cause an impact on the processing time.

According to the present embodiment, the time between the issuance of the instruction to execute the sample observation program and the completion of the preparation for carrying in the sample can be used effectively, and an effect of reduction of the processing time of the apparatus is expected.

The present invention is not limited to the above-described embodiments, and includes various modification examples. For example, the above-described embodiments are examples which are described in detail in order to make it easy to understand the present invention, and are not limited to a case where all of the described configurations are necessarily provided. A part of the configuration of a certain embodiment can be replaced with the configuration of the other embodiment, and the configuration of the other embodiment can also be added to the configuration of a certain embodiment. It is possible to add, remove, or replace other known configurations with respect to a part of the configuration of each embodiment.

REFERENCE SIGNS LIST

101 . . . electron gun
103 . . . first electron lens
104 . . . second electron lens
105 . . . deflector
106 . . . objective electron lens 108 . . . sample stage
109 . . . sample height detector
110 . . . secondary electron detector
111 . . . A/D conversion unit
112 . . . image generation unit
113 . . . overall control unit
114 . . . high-voltage power supply
115 . . . storage unit
116 . . . display unit (display)
117 . . . input unit
118 . . . electron optical system control unit
119 . . . stage control unit

The invention claimed is:

1. A charged particle beam apparatus comprising:
an excitation control unit that controls a focal position by changing a control value of excitation of an electronic lens;
an electrostatic field control unit that controls the focal position by changing a control value of an electrostatic field;
a focal position height estimation unit that estimates a height of the focal position from the control value of the excitation of the electronic lens; and
a control unit that controls the excitation control unit and the electrostatic field control unit, wherein
the control unit compares the height of the focal position estimated by the focal position height estimation unit with a height of a sample surface of a sample to be observed, and according to a result of comparison, determines whether it is necessary to change the control value of the excitation of the electronic lens before observing the sample, and
the control unit estimates the height of the sample surface of the sample to be observed, based on a representative value of the height of the sample surface obtained for a plurality of samples that have been observed already and a distribution width of the height of the sample surface obtained for the plurality of samples that have been observed already.

2. The charged particle beam apparatus of claim 1, wherein
a representative value H(N) of a height of a sample surface of an N-th sample N to be observed is expressed by a formula $$H(N) = \frac{1}{N}\sum_{0}^{N} H(k)$$

where H(k) is a representative value of a height of a sample surface of a sample k (k=1 to N−1, n≥3) in an already-observed sample group i.

3. The charged particle beam apparatus according to claim 2, wherein
a distribution width R(N) of a height of a sample surface of an N-th sample N to be observed is expressed by a formula $$R(N) = \frac{1}{N}\sum_{0}^{N} R(k)$$

where R(k) is a distribution width of a height of a sample surface of a sample k (k=1 to N−1, n≥3) in an already-observed sample group i.

4. The charged particle beam apparatus according to claim 3, further comprising:
a display unit that displays a screen that allows to select which of the observed samples is used to estimate the height of the sample surface of the sample to be observed, wherein
the control unit estimates the surface height of the sample to be observed based on data of the height of the sample surface obtained for the sample selected by selection in the display unit.

5. A charged particle beam apparatus comprising:
an excitation control unit that controls a focal position by changing a control value of excitation of an electronic lens;
an electrostatic field control unit that controls the focal position by changing a control value of an electrostatic field;
a focal position height estimation unit that estimates a height of the focal position from the control value of the excitation of the electronic lens; and
a control unit that controls the excitation control unit and the electrostatic field control unit, wherein
the control unit compares the height of the focal position estimated by the focal position height estimation unit with a height of a sample surface of a sample to be observed, and according to a result of comparison, determines whether it is necessary to change the control value of the excitation of the electronic lens before observing the sample,
the control unit determines whether an absolute value of a difference between the height of the focal position estimated by the focal position height estimation unit and the height of the sample surface of the sample to be observed is smaller than a threshold value, and
the threshold value is set according to a range of the controllable focal positions without changing the excitation of the electronic lens.

6. The charged particle beam apparatus according to claim 5, wherein
the control unit sets the threshold value based on the selected data, from data of the height of the sample surface of the observed sample.

7. The charged particle beam apparatus according to claim 6, further comprising:
a display unit that displays a display screen for selecting data to be used for setting the threshold value, from data of the height of the sample surface of the observed sample.

8. The charged particle beam apparatus according to claim 7, wherein
the display screen is configured to be capable of selecting a first observed sample having a first height difference and a second observed sample having a second height difference different from the first height difference.

9. The charged particle beam apparatus according to claim 1, wherein
the control unit compares the height of the focal position estimated by the focal position height estimation unit with the height of the sample surface of the sample to be observed, and according to a result of the comparison, makes a magnetic hysteresis removal operation executed on the electronic lens different.

10. A charged particle beam apparatus comprising:

an excitation control unit that controls a focal position by changing a control value of excitation of an electronic lens;

an electrostatic field control unit that controls the focal position by changing a control value of an electrostatic field;

a focal position height estimation unit that estimates a height of the focal position from the control value of the excitation of the electronic lens; and a control unit that controls the excitation control unit and the electrostatic field control unit, wherein the control unit compares the height of the focal position estimated by the focal position height estimation unit with a height of a sample surface of a sample to be observed, and according to a result of comparison, determines whether it is necessary to change the control value of the excitation of the electronic lens before observing the sample, the control unit executes control of the focal position by changing the control value of the excitation of the electronic lens without comparing the height of the focal position estimated by the focal position height estimation unit with the height of the sample surface of the sample to be observed, depending on the time required for preparation for carrying the sample to be observed to the charged particle beam apparatus or a sample stage.

11. The charged particle beam apparatus according to claim 2, further comprising a user interface that outputs a mutual relationship between a first axis and a second axis, the first axis indicating a height of the sample surface, or a representative value thereof, while the second axis indicating one or more parameters including time, a number of times of sample observation, positional information of the sample, air pressure, air temperature, and sample preparation condition, and the control unit determines or selects the sample k (k=1 to N−1, n≥3) based on a type of the sample specified based on the mutual relationship or process information.

* * * * *